(12) United States Patent
Errico et al.

(10) Patent No.: US 11,658,674 B2
(45) Date of Patent: May 23, 2023

(54) ANALOG-TO-DIGITAL CONVERTER CIRCUIT, CORRESPONDING SYSTEM AND METHOD

(71) Applicant: STMicroelectronics S.r.l., Agrate Brianza (IT)

(72) Inventors: Nicola Errico, Rho (IT); Marzia Annovazzi, Milan (IT); Alessandro Cannone, Marsala (IT); Enrico Ferrara, Milan (IT); Gea Donzelli, Caronno Pertusella (IT); Paolo Turbanti, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 44 days.

(21) Appl. No.: 17/501,112

(22) Filed: Oct. 14, 2021

(65) Prior Publication Data
US 2022/0149859 A1   May 12, 2022

(30) Foreign Application Priority Data

Nov. 9, 2020   (IT) .......................... 102020000026678

(51) Int. Cl.
*H03M 1/10* (2006.01)
*H03M 1/06* (2006.01)

(52) U.S. Cl.
CPC ....... *H03M 1/1071* (2013.01); *H03M 1/0687* (2013.01)

(58) Field of Classification Search
CPC ............. H03M 1/1071; H03M 1/0687; H03M 1/0678; H03M 1/1076; H03M 1/1225; H03M 1/123; H03M 1/1004
USPC .......................................................... 341/120
See application file for complete search history.

(56) References Cited

U.S. PATENT DOCUMENTS

| | | | |
|---|---|---|---|
| 10,469,095 B2 * | 11/2019 | Lin ......................... | G01S 13/06 |
| 2012/0206282 A1 * | 8/2012 | Gorbold ................... | G05B 9/03 |
| | | | 341/120 |
| 2015/0206282 A1 * | 7/2015 | Kudo ................... | H04N 5/2628 |
| | | | 348/239 |
| 2020/0153447 A1 | 5/2020 | D'Angelo | |
| 2020/0309848 A1 | 10/2020 | Stafford et al. | |

* cited by examiner

*Primary Examiner* — Jean B Jeanglaude
(74) *Attorney, Agent, or Firm* — Slater Matsil, LLP

(57) ABSTRACT

In an embodiment, a circuit includes N sensing channels. Each channel includes a first main sensing node and a second redundancy sensing node paired therewith. N analog-to-digital converters (ADCs) are coupled to the first sensing nodes, with digital processing circuits coupled to the N ADCs. A pair of multiplexers are coupled to the second sensing nodes and to the N ADCs with a further ADC coupled to the output of the second multiplexer. An error checking circuit is coupled to the outputs of the second multiplexer and the further ADC to compare, at each time window in a sequence of N time windows, a first digital value and a second digital value resulting from conversion to digital of: an analog sensing signal at one of the first sensing nodes, and an analog sensing signal at the second sensing node paired with the selected one of the first sensing nodes.

20 Claims, 3 Drawing Sheets

ANALOG-TO-DIGITAL CONVERTER CIRCUIT, CORRESPONDING SYSTEM AND METHOD

CROSS-REFERENCE TO RELATED APPLICATIONS

This application claims the benefit of Italian Patent Application No. 102020000026678, filed on Nov. 9, 2020, which application is hereby incorporated herein by reference.

TECHNICAL FIELD

The present disclosure relates generally to an electronic system and method, and, in particular embodiments, to an analog-to-digital converter (ADC) circuit, corresponding system and method.

BACKGROUND

A high level of safety may be desirable in integrated circuits (ICs) for use in transmission and braking applications in the automotive sector, for thermal sensors for instance.

Specifications such as ISO26262-Functional Safety for Road Vehicles, define a risk classification scheme referred to as ASIL (Automotive Safety Integrity Level) which is helpful in defining safety specifications in line with ISO 26262.

The ASIL scheme is established by performing a risk analysis of a potential hazard by looking at the severity, exposure and controllability of the operating scenario of a vehicle.

There are currently four ASIL categories: ASIL A, ASIL B, ASIL C, ASIL D, where ASIL D dictates the highest integrity specification and ASIL A the dictates the lowest.

A conventional implementation for thermal sensors is based on architecture comprising a small BJT (bipolar junction transistor) sensor in combination with a high-resolution ADC that converts a voltage signal proportional to temperature into a temperature code.

These thermal sensors may be configured, for instance, to measure a temperature in an IC die and currents in valve driver blocks and to provide real-time temperature information to an interpolator in order to achieve desired target accuracy.

Current measurement in valve driver blocks may benefit from (complete) independency of a low-side (LS) path and a high-side (HS) path.

To that end, a whole measurement chain, including a thermal sensor, may be rendered completely independent, which involves implementing a redundant "thermal" ADC, which results in twice-added (2) complexity for each channel.

SUMMARY

Some embodiments address the issues outlined previously while avoiding the added complexity discussed in the foregoing.

Some embodiments relate to safety checks in devices such as analog-to-digital converters (ADCs).

One or more embodiments may be applied in the automotive sector, for instance, in transmission control units and braking control units for current measurement in valve driver blocks.

One or more embodiments may relate to a corresponding system. A multi-channel valve drive system for use in transmission and braking applications in the automotive sector may be exemplary of such a system.

One or more embodiments may relate to a corresponding method.

One or more embodiments may advantageously provide architecture for measuring temperature in an IC die (in a valve driver block, for instance).

In comparison with the prior art (where N channels involve 2×N ADCs), in one or more embodiments, an ADC is associated to a respective main temperature sensor for each channel and redundant temperature sensors are associated to a single shared ADC by using a multiplexer.

In one or more embodiments, a "redundant" temperature measurement of each redundant sensor is provided in a corresponding time frame and real-time measurement of a main temperature sensor is provided so that N channels involve only N+1 ADCs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

As discussed in the introductory portion of this description, transmission control units and braking control units for automotive applications may benefit from a high level of safety (up to ASIL-D), with a safe (alert) state asserted in case of malfunctioning of a component in the control unit.

Such system level specifications are expected to be complied with by all the components in the control unit, especially by those ICs providing a basis for the whole system. In an ASIL-D IC for transmission and braking applications, as considered herein by way of example, such level of safety should desirably be reached for thermal sensors in the first place.

Figure 1:
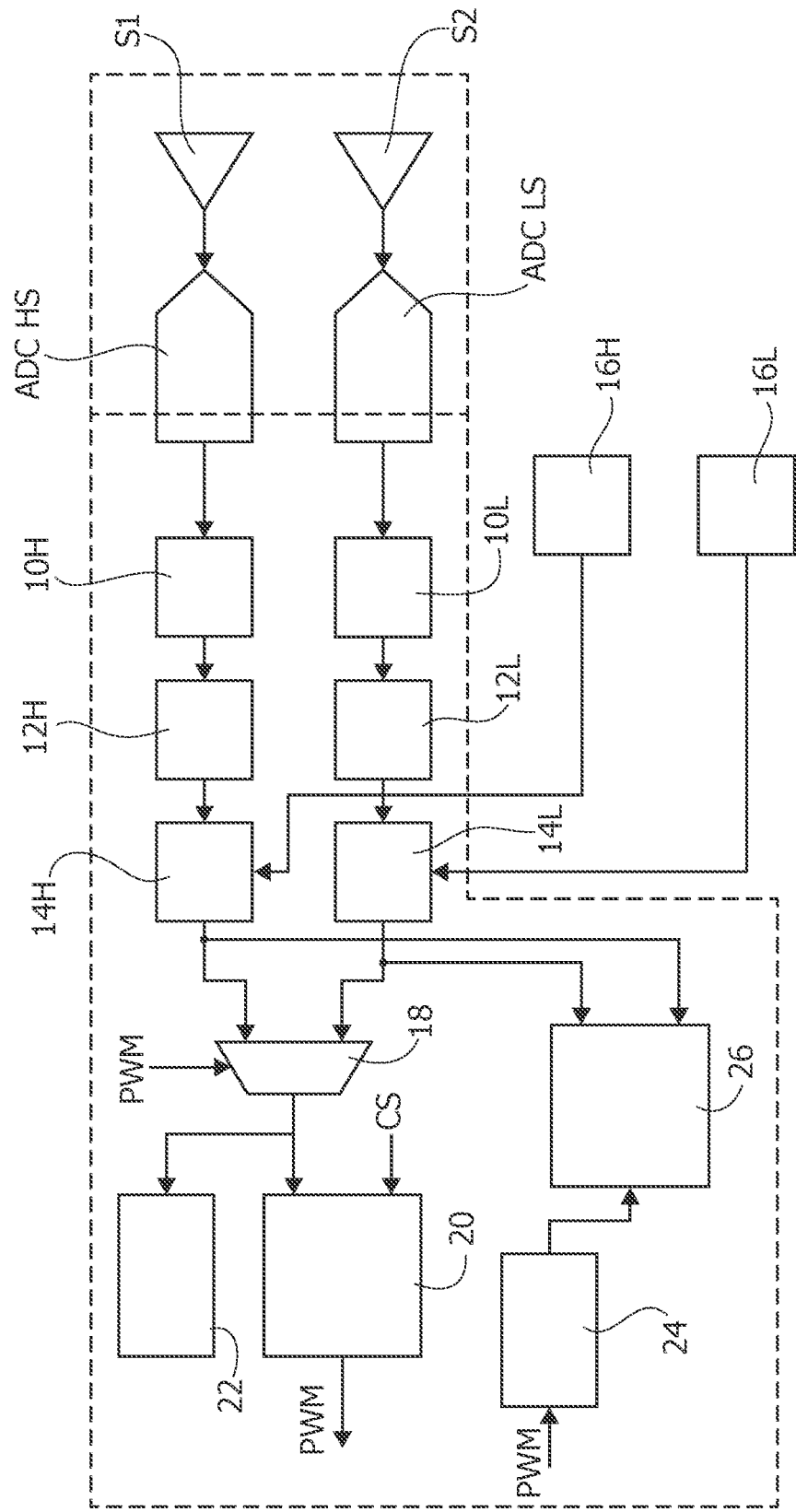
FIG. 1 is a block diagram illustrative of an implementation of independent HS/LS current measurement paths.

FIG. 1 is block diagram exemplary of a conventional implementation for this kind of sensor arrangement comprising sensors S1, S2 (small CSA-certified-BJT sensors, for instance) for high-side (HS) and low-side (LS), respectively. The sensors S1 and S2 co-operate with (high-resolution) ADCs ADC HS and ADC LS that convert voltages proportional to the temperature as provided by the sensors S1 and S2 to a temperature code.

Such thermal sensors can be configured to measure the die temperature of an integrated circuit IC (not visible in the figure) and for current measurement in valve driver blocks to provide real-time temperature to interpolators in order to facilitate achieving a target accuracy.

In current measurement of valve driver blocks independency between LS and HS paths may be desirable.

For that reason, a (single channel) measurement chain as illustrated in FIG. 1, that is, including the sensors S1, S2, includes (completely) independent signal paths.

Independent HS and LS paths as illustrated in FIG. 1 facilitate achieving compliance with ASIL-D specifications and independency of redundant current monitoring (with HS and LS comparable therebetween).

This in turn involves implementing independent temperature interpolation for the two paths (S1, ADC HS and S2, ADC LS) in a single analog channel as illustrated and an intrinsic redundancy of the temperature sensor arrangement.

For instance, for a (single) digital channel to be coupled to an analog channel comprising two sensors S1, S2 and two ADCs, namely ADC HS and ADC LS, an arrangement as illustrated in FIG. 1 comprises:

ADC logic circuitry 10H (high) and 10L (low),
filter circuitry 12H and 12L, and
calibration circuitry 14H and 14L in turn expected to co-operate with (external) calibration temperature sources 16H, 16L.

An arrangement as illustrated in FIG. 1 also comprises a multiplexer 18 driven by an on-off (pulse-width modulated) signal PWM to alternately supply the outputs from the high-side branch and low-side branch discussed previously (essentially the outputs from the calibration circuitry 14H and 14L) to a controller 20 (for instance, a proportional-integral or PI controller) sensitive to a current set point CS and configured to generate the signal PWM.

The (average) value of the output from the multiplexer 18 is indicative of the average current 18 provided by the high-side branch and low-side branch discussed previously and thus of the average value of the temperature sensed by the sensors S1 and S2 as indicated by the block 22.

As illustrated, a PWM monitor circuit 24 receives a PWM feedback signal from the input analog channel in order to verify that such a PWM signal at the output of the valve driver is consistent—for instance, equal, with a certain margin of error—with the value imposed by the controller block 20 (a PI controller, for instance).

Such a signal can be provided by an analog comparator that compares the output voltage with the voltage of the supply (battery). This may take place, for instance, with a threshold having a value which is half the battery value.

This additional safety function facilitates complying with ASIL-D specifications according to ISO26262.

The device may be configured to provide (on SPI registers, for instance) the duty cycle measured by the block 24 and a microcontroller—at the system level'can compare it with the theoretical values set by the block 20 (which can also be read from SPI registers). If the difference exceeds a certain threshold, the microcontroller may set the system to a "safe" state.

As illustrated, comparator circuitry 26 can be coupled to the outputs from the high-side branch and low-side branch discussed previously (the outputs from the calibration circuitry 14H and 14L) with the capability of comparing these two outputs (and thus the temperature values sensed by the sensors S1 and S2).

As illustrated, the information provided by the block 24 is also used by the block 26 (high-side, low-side compare) for diagnostics purposes.

Transmission control units (TCUs) and braking control units for automotive applications may involve a high multiplicity of architectures as illustrated in FIG. 1.

This in turn leads to a considerable impact in term of die size. In fact, N channels involve 2×N thermal sensors (more specifically, 2×N BJT sensors such as S1 and S2 plus 2×N ADCs such as ADC HS and ADC LS).

An arrangement as illustrated in FIG. 1 involves HS and LS paths which are (completely) independent of each other in order to facilitate ASIL-D compliance as well as independent redundant current monitors (in order to facilitate HS-LS comparison at 26, for instance) plus independent temperature interpolators for the two paths.

Figure 2:
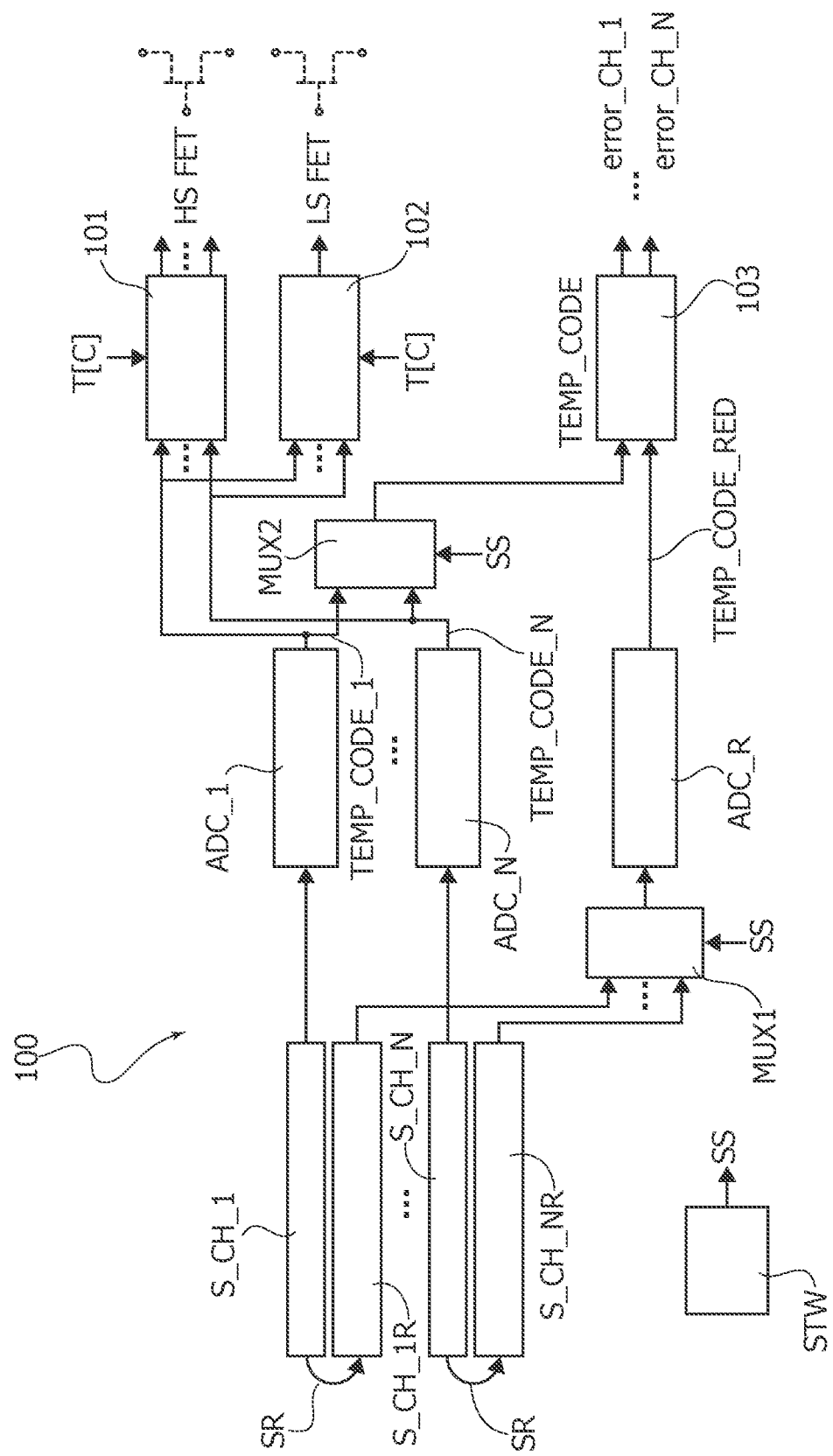
FIG. 2 is a block diagram illustrative of a solution for a driver channel with a high-side FET and a low-side FET in valve driver according to embodiments as exemplified herein.

The diagram of FIG. 2 is illustrative of an embodiment of a valve driver including N channels with High-Side (HS) and Low-Side (LS) field-effect transistors (FETs).

Such a driver (which can otherwise retain certain features of the arrangement illustrated in FIG. 1) can be incorporated, for instance, in a transmission control unit for passenger vehicles and (PVs) and commercial vehicles (CVs). Valve driver stages as implemented in transmission and braking control units are exemplary of such a possible application.

It is otherwise noted that reference to such a possible application is merely exemplary and non-limiting of the embodiments. One or more embodiments can in fact be generally applied to circuits where a high level of safety (up to ASIL-D, for instance) is desirable, which may result in redundancy for each function.

To that effect, accuracy in achieving a target entity (current, for instance) can be facilitated via calibration and temperature interpolation of a thermal sensor implemented with a high-accuracy and high-resolution ADC (analog-to-digital converter).

In one or more embodiments, such an ADC can be implemented in a redundant manner (which facilitates fulfilling ASIL-D requirements, for instance) by providing for "physical" redundancy of a (whole) ADC structure.

One or more embodiments may achieve (full) redundancy via digital signal processing (thus without physical redundancy of a whole ADC), which provides benefits in terms of die size and test time savings and increased diagnosis coverage.

Embodiments as illustrated in FIG. 2 may comprise a number N of channels (channel 1 to channel N) each including two sensors S_CH_1, S_CN_1R to S_CH_N, S_CN_NR.

These sensors can be, for instance, BJT (bipolar junction transistor) thermal sensors. Such an option may be advantageous due to its reduced contribution to thermal sensor area, especially if compared with the larger contribution to the whole thermal sensor area as provided by ADCs, only one of which, namely ADC_1 to ADC_N, is used for each channel as illustrated in FIG. 2.

The sensors in each pair can be regarded as including a first sensor, S_CH_1 to S_CH_N, and a second sensor S_CN_1R to S_CN_NR providing safety redundancy in (e.g. temperature) sensing as indicated by SR.

As illustrated in FIG. 2, the outputs from the first sensors S_CH_1 to S_CH_N are applied to respective ADCs, namely ADC_1 to ADC_N, which may be configured to provide, for instance, analog sigma-delta quantizer and digital decimator functions.

As illustrated in FIG. 2, the outputs from the second, redundancy sensors S_CH_1R to S_CH_NR are applied to a single common ADC, namely ADC_R, which may likewise be configured to provide, for instance, analog sigma-delta quantizer and digital decimator functions.

As illustrated in FIG. 2, supplying the outputs from the redundancy sensors S_CH_R to S_CH_NR to the analog-to-digital converter ADC_R is via a multiplexer MUX1. The multiplexer MUX1 is sensitive to a selector signal SS, which can be generated (in a manner known per se to those of skill in the art, via a time window selector circuit STW) to be indicative of a time window.

In that way, the hardware of the analog-to-digital converter ADC_R can be shared by the N channels, with each channel suited to be processed in a respective time window as discussed in the following.

As result of processing in the analog-to-digital converters, ADC_1 to ADC_N and ADC_R, the analog (e.g. temperature) signals from the sensors S_CH_1 to S_CH_N and S_CH_1R to S_CH_NR are converted into corresponding digital signals (8-bit codes, for instance) TEMP_CODE_1 to TEMP_CODE_N (from the converters ADC_1 to ADC_N coupled individually to the sensors S_CH_1 to S_CH_N) and TEMP_CODE_RED (from the common converter ADC_R coupled to the sensors S_CH_1R to S_CH_NR via the multiplexer MUX1).

References 101 and 102 denote two interpolators (HS and LS, respectively) that receive the digital signals TEMP_CODE_1 to TEMP_CODE_N from the converters, ADC_1 to ADC_N. The interpolators 101, 102 may be of any type known to those of skill in the art for a desired drive function of respective electrical loads such as field-effect transistors HS FET (high-side) and LS FET (low-side).

The outline of such field-effect transistors is represented in dashed lines insofar as these field-effect transistors (and any other electrical load driven by the circuit 100) may be a distinct element from the embodiments.

By way of example, the blocks 101, 102 (which can be regarded as identical) may provide as an output an error value affecting the measurement of an actuation current supplied to a load associated with the respective channel, assumed to be at a certain temperature.

Input to (each) block 101, 102 may comprise a matrix T(C) of current errors for certain temperature and current values taken as a reference, as possibly derived from a memory block (two RAM memory banks, for instance) not visible in the figures for simplicity.

These reference values may be different for each channel and be distinct for high-side and low-side.

By way of example, the blocks 101, 102 may be configured to calculate (in a manner known per se to those of skill in the art) an error value at a generic temperature and current by interpolating that error value starting from the reference values.

A same block 101 (and 102) may repeat the calculation scanning the N channels in a sequential manner. A same block may be replicated in 101 and 102 in order to provide an independent calculation for the high-side (HS) and the low-side (LS). In that way, two independent HS and LS measurements are available which can be compared to ascertain if any misalignments (errors) arise.

It will be otherwise appreciated that the embodiments are largely "transparent" to the specific type of processing performed in blocks such as 101 and 102.

Also, irrespective of the specific drive function which may be implemented therein (in a manner known to those of skill in the art), both interpolators 101 and 102 use the same (temperature) sensors S_CH_1 to S_CH_N and analog-to-digital converters ADC_1 to ADC_N.

Operation of a circuit as illustrated in FIG. 2 lends itself to being monitored via the common "redundant" analog-to-digital converter ADC_R.

In one or more embodiments, such a redundant converter ADC_R can be placed at an IC top level with the capability of multiplexing via the multiplexer MUX1 the signals from the redundant sensors S_CH_1R to S_CH_NR present in each one of the N channels for a time (as set via the signal SS) selected to provide an adequate (e.g. temperature) measurement and to facilitate fulfilling a desired FTTI (fault tolerant time interval).

As illustrated in FIG. 2, a digital processing circuit block 103 is configured to act as a safety ADC checker and compare the (temperature) values read by the "main" sensors S_CH_1 to S_CH_N with corresponding values read by the "redundant" sensors S_CH_1R to S_CH_NR. In principle, the values should be the same assuming that the main and redundant sensors are placed in corresponding positions (the same positions in a semiconductor die, for instance).

In some embodiments, the ADC checker circuit 103 has the purpose of revealing errors affecting any of the channels 1 to N and prompting adequate reaction (for instance setting the channel to a three-state turnoff/low-power condition). In some embodiments, the ADC checker circuit 103 may include a digital comparator.

As illustrated in FIG. 2, the safety ADC checker circuit 103 is configured to act on (to compare):

the (digital) signal TEMP_CODE_RED resulting from analog-to-digital conversion (at the converter ADC_D) of one of the "redundant" sensors S_CH_1R to S_CH_NR selected by the multiplexer MUX1 as a function of the time window selection signal SS from the time window selector circuit STW, a (digital) signal TEMP_CODE selected by multiplexer MUX2 as a function of the time window selection signal SS from the time window selector circuit STW out of the (digital) signals TEMP_CODE_1 to TEMP_CODE_N resulting from analog-to-digital conversion (at the converters ADC_1 to ADC_N) of the signal from the "main" sensors S_CH_1 to S_CH_N.

In a circuit as illustrated in FIG. 2, operation of the multiplexers MUX1, MUX2 can be coordinated in such a way that, at a certain time window j (in a periodic sequence of N windows), the safety ADC checker circuit 103 compares:

a signal TEMP_CODE_j, from the j-th main sensor S_CH_j with j=1, . . . , N, and the signal TEMP_CODE_RED corresponding to the signal from the j-th redundant sensor S_CH_jR with j=1, . . . , N.

As noted, the signals should be notionally identical. In fact comparison at the safety ADC checker circuit 103 may results in N (digital) non-zero errors signals error_CH_1 to error_CH_N (that is, error_CH_j with j=1, . . . , N).

As discussed, these error signals error_CH_1 to error_CH_N may reveal errors affecting any of the channels 1 to N and prompt adequate reaction: for instance, the channel found affected by error being set to a three-state turnoff/low-power condition).

The error signals error_CH_1 to error_CH_N (which may indicate an inconsistency in the measurement of die temperature) can be transmitted from the circuit 100 (on a "fault" pin for instance) and/or be stored in internal registers which can be accessed by a microcontroller, for instance.

Such mismatch errors in measuring temperature may apply both the valve channels and the die, that is, the N channel illustrated herein can be regarded as comprising both the valves and the die.

One or more embodiments may include a temperature control function of the temperature of the whole die.

It is noted that one or more embodiments are in fact largely "transparent" to the intended use of both the signals from the blocks 101, 102 and the signals error_CH_1 to error_CH_N from the block 103.

A circuit as illustrated in FIG. 2 facilitates achieving independency to fulfill specifications such as ASIL-D requirement with reduce die size impact.

A circuit as illustrated in FIG. 2 and including N channels comprises N+1 analog-to-digital converters (ADC_1 to ADC_N plus ADC_R) and 2×N sensors (N main sensors S_CH_1 to S_CH_N and N redundant sensors S_CH_1R to S_CH_NR.

Such an advantage in terms of die size becomes even more evident as the number N of channels increases.

Figure 3:
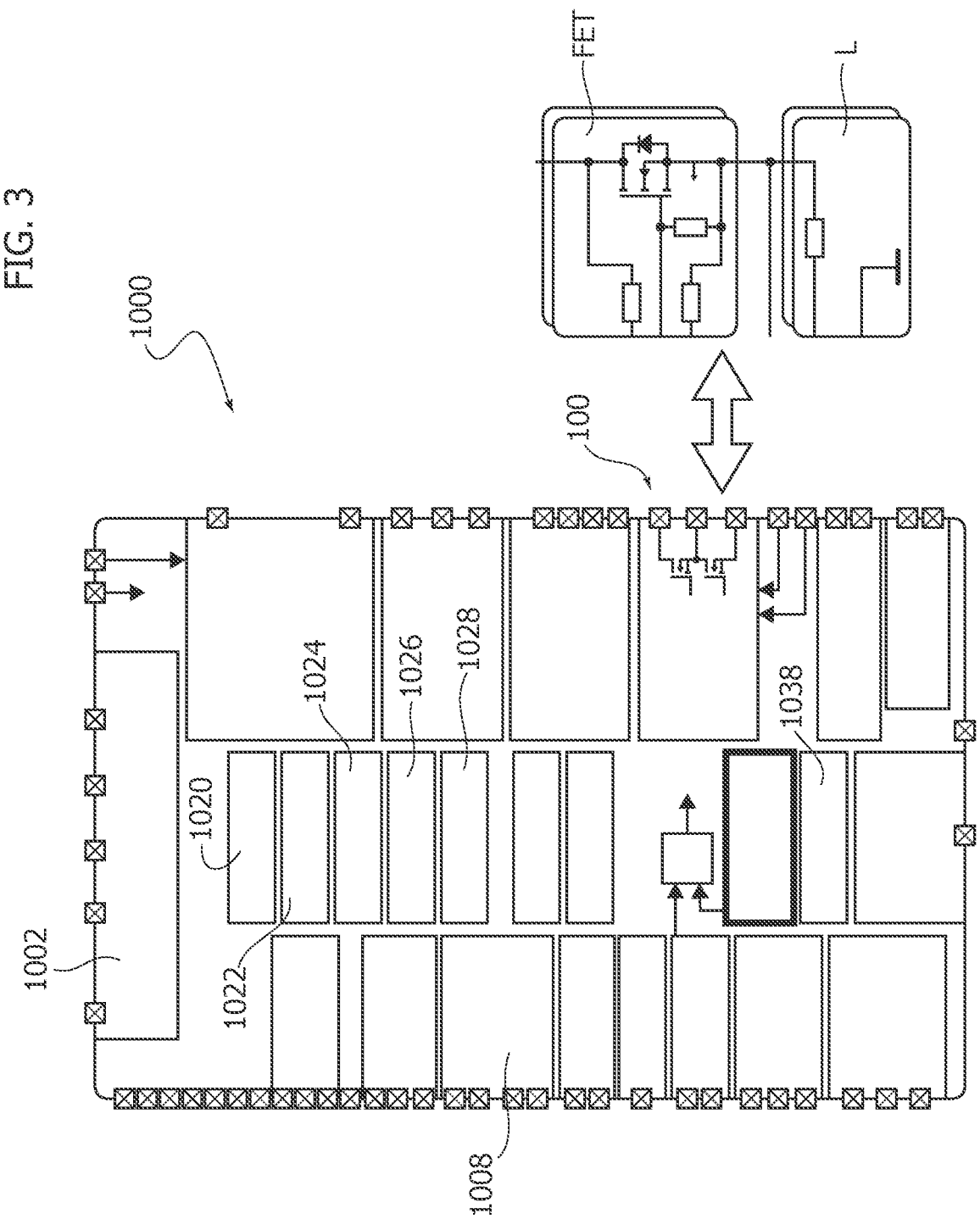
FIG. 3 is a block diagram exemplary of the possible incorporation of embodiments in a transmission control unit.

FIG. 3 is a block diagram exemplary of the possible incorporation of embodiments in a transmission control unit moo for passenger vehicles and (PVs) and commercial vehicles (CVs).

The following designations apply to certain blocks visible in FIG. 3:
- 1002—Charge pump
- 1008—SPI interface
- 1020—Internal supply
- 1022—Auxiliary oscillator
- 1024—Main oscillator
- 1026 and 1028—Main and auxiliary bandgap voltage reference
- 1038—Temperature monitor (cooperating with N-channel current control driver 100 as discussed previously)
- FET—field effect transistors driven by driver 100
- L—load(s) supplied by FET.

Those of skill in the art will otherwise note that a transmission control unit moo as illustrated in FIG. 3 may include various other blocks/elements which are per se conventional in the art and are not expressly mentioned and/or referenced insofar as they are not of specific importance for the embodiments.

A circuit (for instance, 100) as exemplified herein may comprise:

a plurality of N sensing channels, each channel including a pair of a first sensing node (for instance, S_CH_1 to S_CH_N) and a second sensing node (for instance, S_CH_1R to S_CH_NR), wherein each first sensing node has a second sensing node paired therewith (for instance, S_CH_1R paired with S_CH_1, and so on), a plurality of N analog-to-digital converters (for instance, ADC_1 to ADC_N) each of the N analog-to-digital converters coupled to a respective first sensing node (for instance, S_CH_1 to S_CH_N) in the plurality of N sensing channels, first (for instance, 101) and second (for instance, 102) digital processing circuitry coupled to the plurality of N analog-to-digital converters and configured to perform digital processing on the N first digital signals, a first multiplexer (for instance, MUX1) coupled to the second sensing nodes in the plurality of N sensing channels, a second multiplexer (for instance, MUX2) coupled to the outputs of the plurality of N analog-to-digital converters as well as a further analog-to-digital converter (for instance, ADC_R) coupled to the output of said second multiplexer, error checking circuitry (for instance, 103) coupled to the output of the second multiplexer and to the output of said further analog-to-digital converter, wherein:

the first and second multiplexers are configured to operate over a sequence of N time windows and to apply to the error checking circuitry, at each time window in the sequence of N time windows, a first digital value (for instance, TEMP_CODE) resulting from conversion to digital of an analog sensing signal at a selected one of the respective first sensing nodes and a second digital value (for instance, TEMP_CODE_RED) resulting from conversion to digital of an analog sensing signal at the second sensing node out of the second sensing nodes paired with the selected one of said respective first sensing nodes, and the error checking circuitry is configured to compare, at each time window in the sequence of N time windows, the first digital value and the second digital value and produce over the sequence of N time windows, N sensing error signals (for instance, error_CH_1, . . . , error_CH_N) as a function of the difference between the first digital sensing value and the further digital sensing value.

In a circuit as exemplified herein, the first and second digital processing circuitry coupled to the plurality of N analog-to-digital converters may be configured to perform interpolator digital processing on the N first digital signals as a function of a set of reference signals (for instance, T(C)) received at the first and second (102) digital processing circuitry.

A circuit as exemplified may comprise:

first, high-side digital processing circuitry (for instance, 101) configured to drive a high-side electrical load (for instance, HS FET), and second, low-side digital processing circuitry (for instance, 102) configured to drive a low-side electrical load (for instance, LS FET).

In a circuit as exemplified herein the first and second digital processing circuitry may be configured to be sequentially scan the plurality of N analog-to-digital converters (for instance, ADC_1 to ADC_N) to obtain therefrom said N first digital signals to perform digital processing on said N first digital signals.

A circuit as exemplified herein may be configured to:

transmit from the circuit said N sensing error signals (for instance, error_CH_1, . . . , error_CH_N), and/or store in the circuit (100) the N sensing error signals.

In a circuit as exemplified herein each sensing channel in said plurality of N sensing channels may comprise at least one thermal sensor providing a temperature sensing signal to one of the first sensing node (for instance, S_CH_1 to S_CH_N) and the second sensing node (for instance, S_CH_1R to S_CH_NR) paired therewith.

A circuit as exemplified herein may comprise a first sensor supplying a first sensing signal to the first sensing node and a second sensor providing a second sensing signal to the second sensing node paired therewith.

A system (for instance, a transmission control unit moo for passenger and commercial vehicles such as moo) as exemplified herein may comprise:

a circuit as exemplified herein, at least one power switch (for instance, HS FET, LS FET; FET) coupled to the first and second digital processing circuitry and configured to be driven by the first and second digital processing circuitry, and at least one electrical load (for instance, L) controllably supplied via the at least one power switch (for instance, HS FET, LS FET; FET).

A method of operating a circuit or a system as exemplified herein may comprise:

collecting respective sensing signals via the plurality of N sensing channels, operating the first and second (102) digital processing circuitry to perform digital processing on the N first digital signals as a function of the N sensing error signals (for instance, error_CH_1, . . . , error_CH_N) produced by the error checking circuitry (for instance, 103) over the sequence of N time windows.

Without prejudice to the underlying principles, the details and embodiments may vary, even significantly, with respect to what has been described by way of example only, without departing from the extent of protection.

The extent of protection is determined by the annexed claims.

What is claimed is:

1. An electronic circuit comprising:
N sensing channels, each of the N sensing channels comprising a pair of sensing nodes comprising first and second sensing nodes, wherein N is a positive integer greater than 1;
N analog-to-digital converters, each of the N analog-to-digital converters having an input coupled to a respective first sensing node of the N sensing channels;
a first multiplexer having inputs respectively coupled to the second sensing nodes of N sensing channels;
a second multiplexer having inputs respectively coupled to outputs of the N analog-to-digital converters;
a further analog-to-digital converter having an input coupled to an output of the first multiplexer; and
an error checking circuit coupled to an output of the second multiplexer and to an output of the further analog-to-digital converter, wherein:
the first and second multiplexers are configured to operate over a sequence of N time windows and to apply to the error checking circuit, at each time window in the sequence of N time windows, a first digital value resulting from a conversion to digital of an analog sensing signal at a selected one of the respective first sensing nodes of the N sensing nodes and a second digital value resulting from a conversion to digital of an analog sensing signal at the second sensing node of the N second sensing nodes paired with the selected one of the respective first sensing nodes, and
the error checking circuit is configured to compare, at each time window in the sequence of N time windows, the first digital value and the second digital value and produce over the sequence of N time windows, N sensing error signals as a function of the difference between the first digital value and the second digital value.

2. The electronic circuit of claim 1, further comprising first and second digital processing circuits coupled to the N analog-to-digital converters.

3. The electronic circuit of claim 2, wherein the first and second digital processing circuits are configured to perform interpolator digital processing on the N first digital values as a function of a set of reference signals received at the first and second digital processing circuits.

4. The electronic circuit of claim 2, wherein the first digital processing circuit is configured to drive a high-side electrical load, and wherein the second digital processing circuit is configured to drive a low-side electrical load.

5. The electronic circuit of claim 2, wherein the first digital processing circuit is coupled to a high-side field-effect transistor (FET), and wherein the second digital processing circuit is coupled to a low-side FET.

6. The electronic circuit of claim 2, wherein the first and second digital processing circuits are configured to sequentially scan the N analog-to-digital converters to obtain therefrom the N first digital values to perform digital processing on the N first digital values.

7. The electronic circuit of claim 1, wherein the electronic circuit is configured to transmit from the electronic circuit the N sensing error signals.

8. The electronic circuit of claim 1, wherein the electronic circuit is configured to store in the electronic circuit the N sensing error signals.

9. The electronic circuit of claim 1, wherein each of the N sensing channels comprises a pair of thermal sensors configured to provide respective temperature sensing signals to the first and second sensing nodes of the respective pair of sensing nodes.

10. The electronic circuit of claim 9, wherein each thermal sensor of the N sensing channels comprises a bipolar junction transistor.

11. The electronic circuit of claim 1, further comprising:
a first sensor configured to supply a first sensing signal to the first sensing node of one pair of sensing nodes of the N sensing channels; and
a second sensor configured to supply a second sensing signal to the second sensing node of the one pair of sensing nodes.

12. A system comprising:
a power switch;
an electrical load configured to be controllably supplied via the power switch; and
an electronic circuit configured to control the power switch, the electronic circuit comprising:
N sensing channels, each of the N sensing channels comprising a pair of sensing nodes comprising first and second sensing nodes, wherein N is a positive integer greater than 1,
N analog-to-digital converters, each of the N analog-to-digital converters having an input coupled to a respective first sensing node of the N sensing channels,
a first multiplexer having inputs respectively coupled to the second sensing nodes of the N sensing channels,
a second multiplexer having inputs respectively coupled to outputs of the N analog-to-digital converters,
a further analog-to-digital converter having an input coupled to an output of the first multiplexer, and
an error checking circuit coupled to an output of the second multiplexer and to an output of the further analog-to-digital converter, wherein:
the first and second multiplexers are configured to operate over a sequence of N time windows and to apply to the error checking circuit, at each time window in the sequence of N time windows, a first digital value resulting from a conversion to digital of an analog sensing signal at a selected one of the respective first sensing nodes of the N sensing channels and a second digital value resulting from a conversion to digital of an analog sensing signal at the second sensing node of the N sensing channels that is paired with the selected one of the respective first sensing nodes, and the error checking circuit is configured to compare, at each time window in the sequence of N time windows, the first digital value and the second digital value and produce over the sequence of N time windows, N sensing error signals as a function of the difference between the first digital value and the second digital value.

13. The system of claim 12, wherein the system is a transmission control unit of a motor vehicle.

14. The system of claim 12, further comprising:
a charge pump circuit;
an oscillator circuit;
a bandgap circuit;
a temperature monitor; and
a communication interface of the serial peripheral interface (SPI) type.

15. A method comprising:
collecting, at each time window in a sequence of N time windows, a first digital value from a selected analog-to-digital converter of N analog-to-digital converters, wherein each of the N analog-to-digital converters has an input coupled to a respective first sensing node of a respective pair of sensing nodes of N sensing channels, and wherein N is a positive integer greater than 1;
collecting, at each time window in the sequence of N time windows, a second digital value from a further analog-to-digital converter coupled to N second sensing nodes of the N sensing channels, wherein, at each time window in the sequence of N time windows, the second digital value produced by the further analog-to-digital converter results from a conversion to digital of an analog sensing signal at a selected second sensing node of the N sensing channels, and wherein the selected second sensing node is paired with the first sensing node that is coupled to the selected analog-to-digital converters;

comparing, at each time window in the sequence of N time windows, the first and second digital values to produce a sensing error signal as a function of the difference between the first digital value and the second digital value; and operating first and second digital processing circuits to perform digital processing on the N first digital values produced over the sequence of N time windows as a function of the N sensing error signals produced over the sequence of N time windows.

16. The method of claim 15, further comprising:
providing an actuation current to a load with a power transistor; and
controlling the power transistor based on the N sensing error signals.

17. The method of claim 16, wherein controlling the power transistor is further based on a set of reference signals received by the first and second digital processing circuits.

18. The method of claim 15, further comprising storing in a memory the N sensing error signals.

19. The method of claim 15, further comprising:
generating N first analog sensing signals at respective N first sensing nodes of the N sensing channels with N respective first thermal sensors; and
generating N second analog sensing signals at respective N second sensing nodes of the N sensing channels with N respective second thermal sensors.

20. The method of claim 15, wherein the N analog-to-digital converters, the further analog-to-digital converter, the first and second digital processing circuits, and the N sensing channels, are part of an electronic circuit, the method further comprising using the electronic circuit for current measurements in a valve driver of a motor vehicle.

* * * * *